(12) United States Patent
Aude

(10) Patent No.: US 6,930,542 B1
(45) Date of Patent: *Aug. 16, 2005

(54) DIFFERENTIAL GAIN BOOSTING

(75) Inventor: Arlo Aude, Atlanta, GA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/461,629

(22) Filed: Jun. 13, 2003

(51) Int. Cl.$^7$ .............................................. G05F 1/10
(52) U.S. Cl. ........................ 327/543; 327/108; 327/563
(58) Field of Search .............................. 327/108, 563, 327/538, 543; 330/257, 260, 261; 323/312, 323/315, 316

(56) References Cited

U.S. PATENT DOCUMENTS

| | | | |
|---|---|---|---|
| 4,292,584 A | * | 9/1981 | Kusakabe .................... 323/316 |
| 5,337,021 A | | 8/1994 | Zarabadi et al. |
| 5,748,040 A | * | 5/1998 | Leung .......................... 330/253 |
| 6,177,838 B1 | * | 1/2001 | Chiu ............................ 330/253 |
| 6,831,501 B1 | * | 12/2004 | Aude ........................... 327/538 |

OTHER PUBLICATIONS

Gray et al, "Analysis and Design of Analog Integrated Circuits," Fourth Edition, pp. 273-274.

* cited by examiner

Primary Examiner—Timothy P. Callahan
Assistant Examiner—Terry L. Englund
(74) Attorney, Agent, or Firm—Darby & Darby P.C.; Matthew M. Gaffney

(57) ABSTRACT

A current source circuit with differential gain boosting is provided. The current source circuit differentially provides first and second currents. The first current is produced by a first cascoded current source, and the second current is produced by a second cascoded current source. Each of the cascoded current sources comprises a current source transistor and a cascode transistor. The current source circuit has high output impedance because a voltage associated with a gate of the cascode transistor of the first cascoded current source and another voltage associated with a gate of a cascode transistor of the second cascoded current source are each forced to an approximately constant voltage by a differential amplifier. The drain voltage of the first and second current source transistors are each servoed to the saturation drain to source voltage of the first current source transistor.

19 Claims, 2 Drawing Sheets

US 6,930,542 B1

DIFFERENTIAL GAIN BOOSTING

FIELD OF THE INVENTION

The present invention relates to current sources, and, in particular, to a current source with differential gain boosting.

BACKGROUND OF THE INVENTION

Current sources are configured to provide an approximately constant output current to a load over a specified range of load voltages. High output impedance is an important characteristic for a current source. When a current source has a high output impedance, changes in the load conditions result in minimal changes in the output current that is provided to the load. Another important characteristic for current sources is output compliance, the range of load voltages for which an approximately constant output current is maintained.

Current sources have numerous applications. For example, current sources can be used as active loads (e.g. for differential amplifiers). Current sources can be used to bias other circuit elements. Current sources are also used in integrators and ramp generators.

BRIEF DESCRIPTION OF THE DRAWINGS

Non-limiting and non-exhaustive embodiments of the present invention are described with reference to the following drawings.

DETAILED DESCRIPTION OF THE PREFERRED EMBODIMENT

Figure 1:
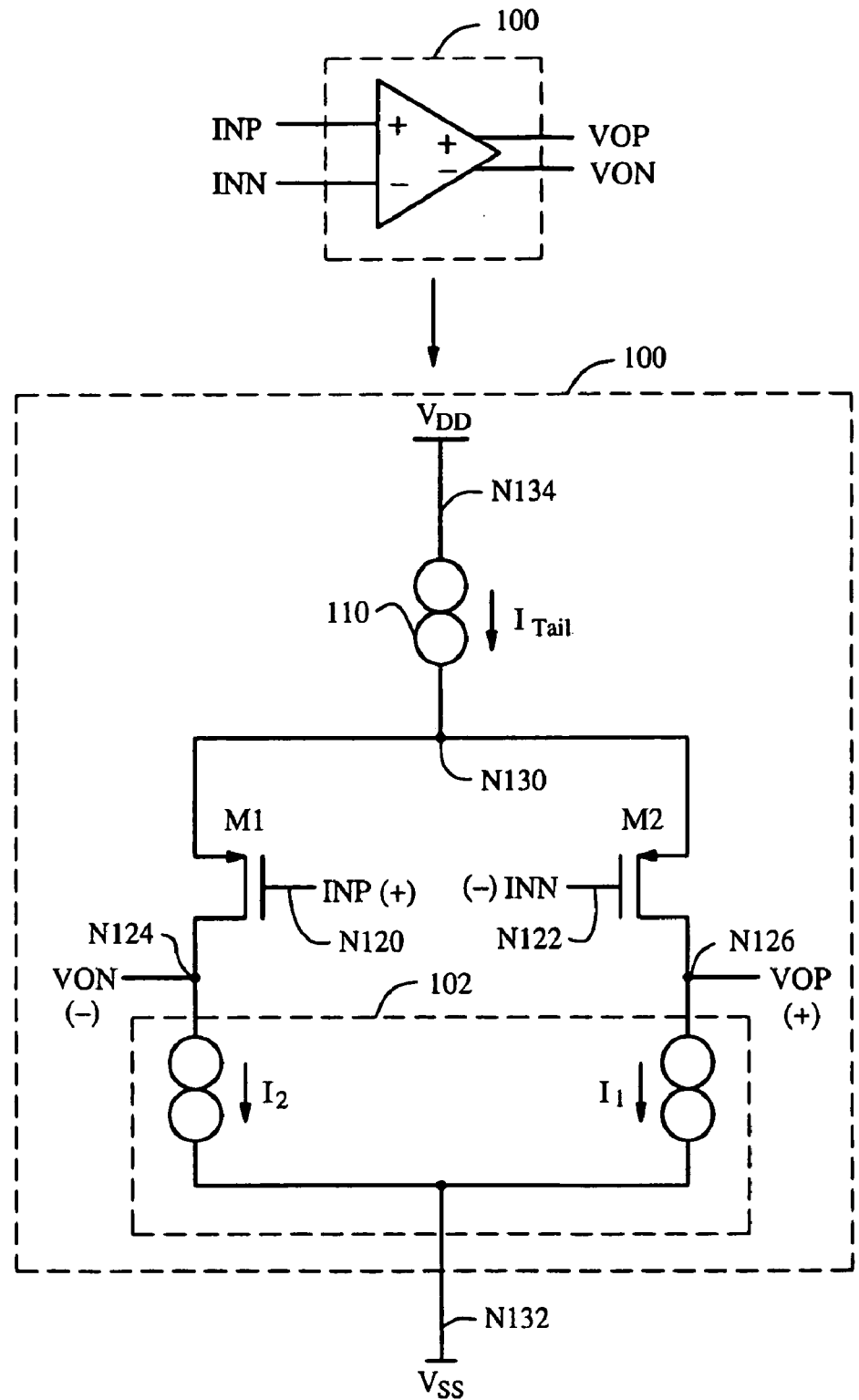
FIG. 1 is an illustration of an example embodiment of a differential amplifier circuit.

Throughout the specification and claims, the following terms take the meanings explicitly associated herein, unless the context clearly dictates otherwise. The meanings identified below are not intended to limit the terms, but merely provide illustrative examples for the terms. The meaning of "a," "an," and "the" includes plural reference, the meaning of "in" includes "in" and "on." The term "connected" means a direct electrical connection between the items connected, without any intermediate devices. The term "coupled" means either a direct electrical connection between the items connected, or an indirect connection through one or more passive or active intermediary devices. The term "circuit" means either a single component or a multiplicity of components, either active and/or passive, that are coupled together to provide a desired function. The term "signal" means at least one current, voltage, charge, temperature, data, or other signal. Referring to the drawings, like numbers indicate like parts throughout the views.

Briefly stated, the invention is related to a current source circuit with differential gain boosting. The current source circuit differentially provides first and second currents. The first current is produced by a first cascoded current source, and the second current is produced by a second cascoded current source. Each of the cascoded current sources comprises a current source transistor and a cascode transistor. The current source circuit has high output impedance because a voltage associated with a gate of the cascode transistor of the first cascoded current source and another voltage associated with a gate of a cascode transistor of the second cascoded current source are each forced to an approximately constant voltage by a differential amplifier. The drain voltage of the first and second current source transistors are each servoed to the saturation drain to source voltage of the first current source transistor.

FIG. 1 is an illustration of an example embodiment of a differential amplifier circuit (100) that is arranged in accordance with aspects of the present invention. Differential amplifier circuit 100 includes transistor M1, transistor M2, differential current source circuit 102, and current source circuit 110. Transistor M1 has a gate that is coupled to node N120, a drain that is coupled to node N124, and a source that is coupled to node N130. Transistor M2 has a gate that is coupled to node N122, a drain that is coupled to node N126, and a source that is coupled to node N130. Differential current source circuit 102 has a first port that is coupled to node N124, a second port that is coupled to node N126, and a third port that is coupled to node N132. Current source circuit 110 has a first port that is coupled to node N130 and a second port that is coupled to node N134.

In operation, a first power supply signal ($V_{DD}$) is applied at node N134, and a second power supply signal ($V_{SS}$) is applied at node N132. Differential amplifier circuit 100 is arranged to provide a differential output signal across nodes N124 and N126 in response to a differential input signal that is received across nodes N120 and N122. Differential current source circuit 102 is arranged to operate as an active load for differential amplifier circuit 100. Differential current source circuit 102 is further configured to differentially provide current 11 and current 12. Differential current source circuit 102 is further configured to provide common mode noise rejection, and to reduce or eliminate even order distortion in circuit 100.

Differential current source circuit 102 is arranged for differential gain boosting, as explained in greater detail below. Differential current source circuit 102 has high output impedance utilizing differential gain boosting techniques.

Figure 2:
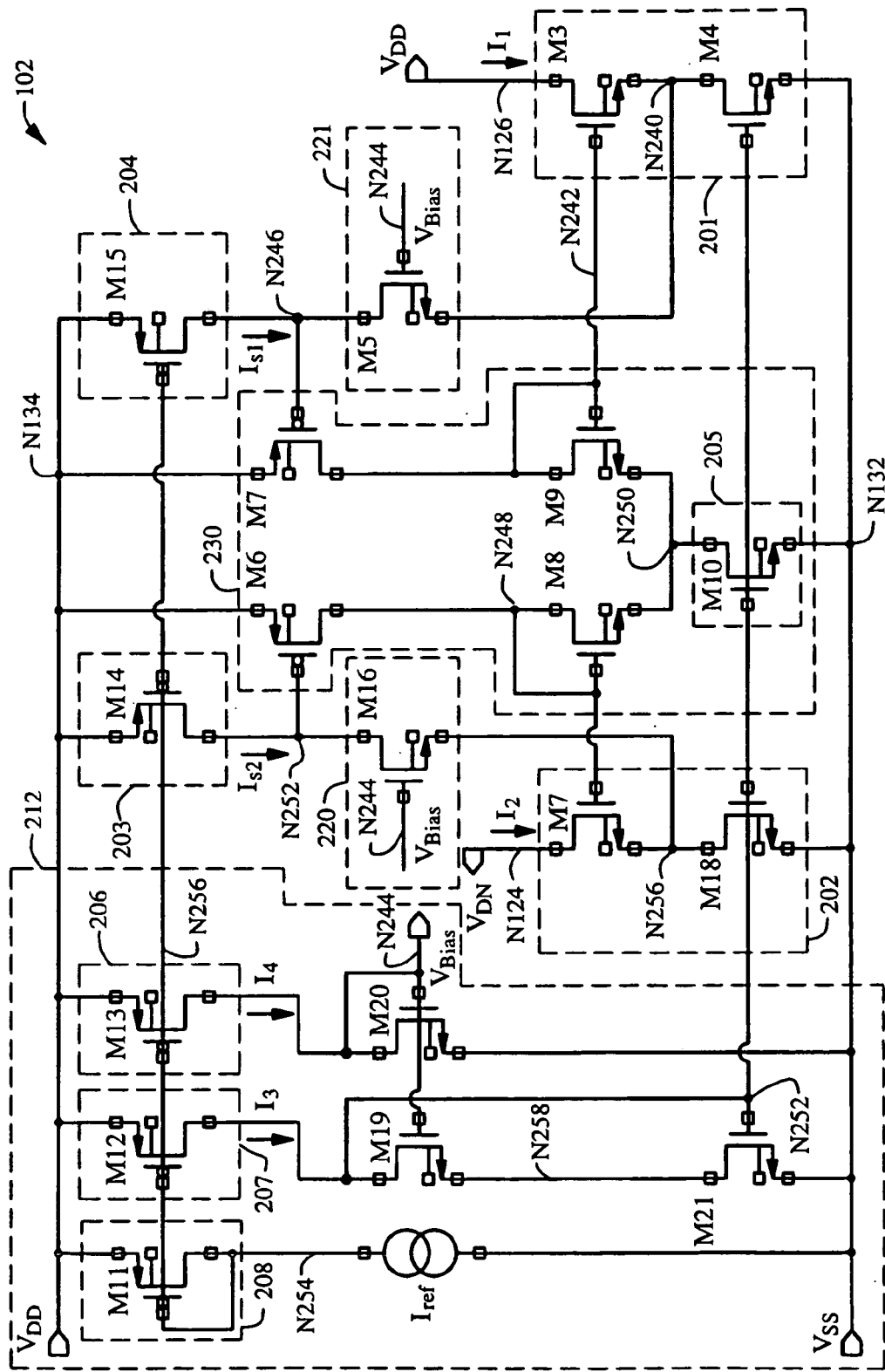
FIG. 2 is an illustration of an example embodiment of a current source circuit, arranged in accordance with aspects of the present invention.
Figure 2:
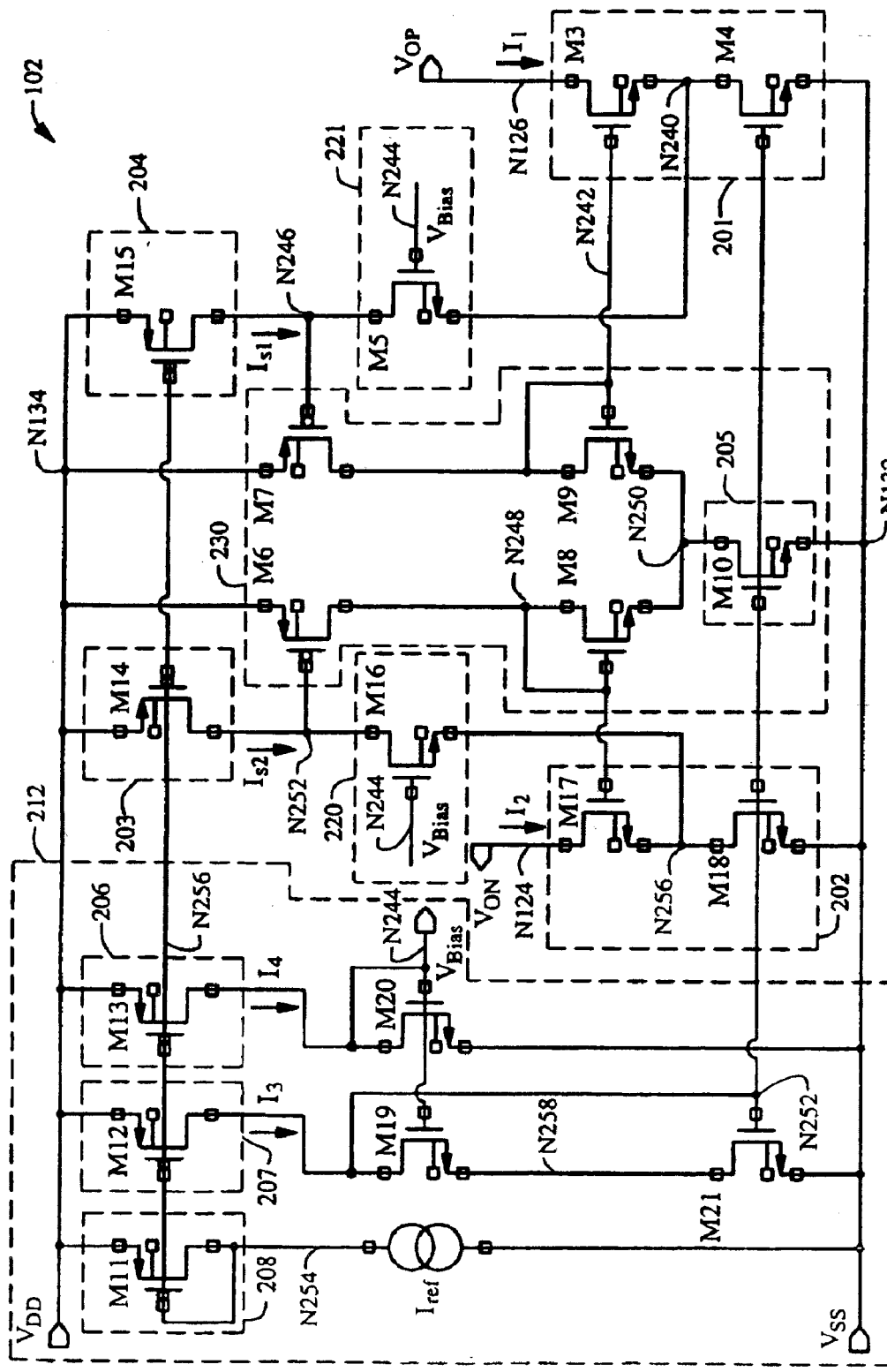

FIG. 2 is an illustration of an example embodiment of a differential current source circuit (102) that is arranged in accordance with aspects of the present invention. The example embodiment of differential current source circuit 102 that is illustrated in FIG. 2 comprises current source circuits (201–204), a bias circuit (212), follower circuits (220, 221), and a differential amplifier circuit (230). An example embodiment of current source circuit 201 comprises transistors (M3, M4). An example embodiment of current source circuit 202 includes transistors (M17, M18). An example embodiment of differential amplifier circuit 230 comprises transistors (M6–M9) and a current source (205).

An example embodiment of follower circuit 220 comprises a transistor (M16). An example embodiment of follower circuit 221 comprises a transistor (M5). An example embodiment of bias circuit 212 includes current source circuits (206–208 and Iref) and transistors (M19–M21). An example embodiment of current source circuit 205 comprises a transistor (M10). An example embodiment of current source circuit 208 comprises a transistor (M11). An example embodiment of current source circuit 207 comprises a transistor (M12). An example embodiment of current source circuit 206 comprises a transistor (M13). An example embodiment of current source circuit 203 comprises a transistor (M14). An example embodiment of current source circuit 204 comprises a transistor (M15).

Transistor M3 has a gate that is coupled to node N242, a source that is coupled to node N240, and a drain that is coupled to node N126. Transistor M4 has a gate that is coupled to node N252 a source that is coupled to node N132, and a drain that is coupled to node N240. Transistor M5 has a gate that is coupled to node N244, a source that is coupled to node N240, and a drain that is coupled to node N246. Transistor M6 has a gate that is coupled to node N252, a source that is coupled to node N134, and a drain that is coupled to node N248. Transistor M7 has a gate that is coupled to node N246, a source that is coupled to node N134, and a drain that is coupled to node N242. Transistor M8 has a gate that is coupled to node N248, a source that is coupled to node N250, and a drain that is coupled to node N248. Transistor M9 has a gate that is coupled to node N242, a source that is coupled to node N250, and a drain that is coupled to node N242.

Transistor M10 has a gate that is coupled to node N252, a source that is coupled to node N132, and a drain that is coupled to node N250. Transistor M11 has a gate that is coupled to node N254, a source that is coupled to node N134, and a drain that is coupled to node N254. Transistor M12 has a gate that is coupled to node N254, a source that is coupled to node N134, and a drain that is coupled to node N252. Transistor M13 has a gate that is coupled to node N254, a source that is coupled to node N134, and a drain that is coupled to node N244. Transistor M14 has a gate that is coupled to node N254, a source that is coupled to node N134, and a drain that is coupled to node N252. Transistor M15 has a gate that is coupled to node N254, a source that is coupled to node N134, and a drain that is coupled to node N246. Transistor M16 has a gate that is coupled to node N244, a source that is coupled to node N256, and a drain that is coupled to node N252.

Transistor M17 has a gate that is coupled to node N248, a source that is coupled to node N256, and a drain that is coupled to node N124. Transistor M18 has a gate that is coupled to node N252, a source that is coupled to node N132, and a drain that is coupled to node N256. Transistor M19 has a gate that is coupled to node N244, a source that is coupled to node N258, and a drain that is coupled to node N252. Transistor M20 has a gate that is coupled to node N244, a source that is coupled to node N132, and a drain that is coupled to node N244. Transistor M21 has a gate that is coupled to node N252, a source that is coupled to node N132, and a drain that is coupled to node N258. Current source circuit Iref is coupled between node N132 and node N254.

In operation, a first power supply signal ($V_{DD}$) is applied at node N134, and a second power supply signal ($V_{SS}$) is applied at node N132. Current source circuit 201 is arranged to provide current I1, and current source circuit 202 is arranged to provide current I2. Transistors M3 and M17 are each arranged to operate as a cascode transistor. Differential amplifier circuit 230 is arranged to provide a differential output signal across nodes N242 and N248 in response to a differential input signal that is received across nodes N246 and N252.

Current source 204 is configured to provide a relatively constant current ($I_{S1}$) to follower circuit 221. Current $I_{S1}$ corresponds to a relatively small fraction of I1. Similarly, current source 203 is configured to provide a relatively constant current ($I_{S2}$) to follower circuit 220. Current $I_{S2}$ corresponds to a relatively small fraction of I2. Follower circuit 221 is arranged in a feedback loop to servo the voltage at node N240 to a predetermined voltage. Similarly, according to one example, follower circuit 220 is arranged in a feedback loop to servo the voltage at node N256 to the predetermined voltage. According to this example, transistor M5 and M16 are matched transistors that are configured as source followers. Transistors M5 and M16 are each further configured to receive signal vbias at the gate of the transistor.

The voltage at node N240 and the voltage at node N256 each correspond to the difference between the voltage associated with signal vbias and the $V_{GS}$ (gate-to-source voltage) of transistor M5 (or M16). According to one example, the voltage associated with signal vbias corresponds to the sum of the $V_{GS}$ of transistor M5 and the $V_{DSSAT}$ (saturation drain-to-source voltage) of transistor M4. For this example, the voltage at node N240 and the voltage at node N256 are each servoed to a voltage corresponding to the $V_{DSSAT}$ of transistor M4. Transistor M4 is matched to transistor M18. The output compliance of differential current source 102 is extended by servoing each of the voltage at node N240 and the voltage at node N256 to the $V_{DSSAT}$ Of transistor M4. In one example, the output compliance of differential current source circuit 102 is extended such that the load voltage may be as low as one $V_{DSSAT}$ from $V_{SS}$.

The voltage at node N242 is forced to an approximately constant voltage according to a negative feedback loop, as follows below. Transistor M3 further configured to operate as a source follower such that the voltage at node N240 increases when the voltage at node N242 increases. Transistor M5 is arranged to receive an approximately constant drain current, such that the voltage associated with drain of transistor M5 increases when $V_{GS}$ of transistor M5 decreases. Accordingly, the voltage at node N246 increases when the voltage at node N240 increases. Node N246 corresponds to an input of differential amplifier circuit 230, and node N242 corresponds to an output of differential amplifier circuit 230. Differential amplifier circuit 230 is arranged such that the voltage at node N242 decreases when the voltage at node N246 increases, thereby completing the negative feedback loop.

In a similar manner, the voltage at node N248 is forced to an approximately constant voltage according another negative feedback loop. Because the voltage at node N248 and the voltage at node N242 are each forced to an approximately constant voltage, differential current source 102 has high output impedance.

Differential current source circuit 102 has a dominant pole that occurs at a high frequency. The dominant pole is associated with the gates of transistors M6 and M7. The negative feedback loop may be compensated via increased capacitance at the gates of transistors M6 and M7.

According to one example, transistors M3 and M17 each have a large parasitic capacitance (e.g. CGS) relative to the other circuit elements of differential current source 102. Node N242 is a low impedance node because transistor M9 is configured as a diode. Similarly, node N248 is a low impedance node because transistor M8 is configured as a diode. The pole that is associated with transistor M3 corresponds to a high frequency because the capacitance associated with transistor M3 is driven by a low impedance node (N242). Similarly, the pole that is associated with transistor M117 corresponds to a high frequency because the capacitance associated with transistor M17 is driven by a low impedance node (N248).

Stability of differential current source 102 may be adjusted by adjusting the sizes of transistors M6–M10. When transistors M6–M10 are larger, the dominant pole decreases in frequency, and the non-dominant pole increases in frequency. Therefore, the stability of differential current source 102 is increased when the sizes of transistors M6–M10 are increased.

Bias circuit 212 is configured provide signal vbias at node 244. According to one example, bias circuit 212 is configured to provide signal vbias such that vbias has an associated voltage that approximately corresponds to the sum of $V_{GS}$ of transistor M5 and $V_{DSSAT}$ of transistor M4. Alternatively, bias circuit 212 may be configured to track another voltage. For example, bias circuit 212 may be configured to track $V_{DD}$.

One example embodiment of bias circuit 212 is configured to operate as follows below. Transistor M12 is configured to produce current I3, and transistor M13 is configured to produce current I4. Transistors M12 and M13 are matched, so that I3=I4. Transistor M20 is sized to provide signal vbias such that the voltage associated with signal vbias corresponds to approximately the sum of $V_{GS}$ and $V_{DSSAT}$. For example, the size of transistor M20 may be ¼ the size of M21. In another example, another size (e.g. ⅕) may be used for transistor M20. Because the size of transistor M20 is less or equal to ¼ the size of transistor M21, and the current received by transistor M20 (I4) is equal to the current received by transistor M21 (I3), the minimum voltage associated with signal vbias is approximately the sum of $V_{GS}$ and $V_{DSSAT}$.

Many alternative embodiments are within the scope of the present invention. One or more of the current source circuits (201–208) may be replaced with alternative embodiments of a current source circuit. For example, one or more of the current sources 203–208 may include a cascode transistor. Additionally, cascode transistors may be included with one or more of the transistors in differential amplifier circuit 230.

Differential current source circuit 102 may be used as an active load for a differential amplifier circuit, as illustrated in FIG. 1. Alternatively, differential current source circuit 102 may be used in other applications.

The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. A current source circuit with differential gain boosting, comprising:
   a first current source circuit that is coupled to a first output node, a first sense node, and a second sense node, wherein the first current source circuit is arranged to respond to a first feedback signal from the second sense node;
   a second current source circuit that is coupled to a second output node, a third sense node, and a fourth sense node, wherein the second current source circuit is arranged to respond to a second feedback signal from the fourth sense node;
   a first follower circuit that is coupled between the first sense node and a fifth sense node, wherein the first follower circuit is arranged to respond to a reference signal from a reference node and also respond to a first sense signal from the first sense node;
   a second follower circuit that is coupled between the third sense node and a sixth sense node, wherein the second follower circuit is arranged to respond to the reference signal from the reference node and also respond to a third sense signal that is received at the third sense node; and
   a differential amplifier circuit having a first amplifier input, a second amplifier input, a first amplifier output, and a second amplifier output, wherein the first amplifier input is coupled to the fifth sense node, the second amplifier input is coupled to the sixth sense node, the first amplifier output is coupled to the second sense node, and the second amplifier output is coupled to the fourth sense node.

2. The current source circuit of claim 1, wherein the differential amplifier circuit is further configured such that the first amplifier output and the second amplifier outputs are low impedance.

3. The current source circuit of claim 1, wherein:
   the first follower circuit comprises a fifth transistor having a fifth gate, a fifth drain, and a fifth source, wherein the fifth gate is coupled to the reference node, the fifth source is coupled to the first sense node, and the fifth drain is coupled to the fifth sense node; and
   the second follower circuit comprises a sixth transistor having a sixth gate, a sixth drain, and a sixth source, wherein the sixth gate is coupled to the reference node, the sixth source is coupled to the third sense node, and the sixth drain is coupled to the sixth sense node.

4. The current source circuit of claim 1, further comprising:
   a bias circuit having a bias output, wherein the bias output is coupled to the reference node;
   a third current source circuit that is coupled to the fifth sense node; and
   a fourth current source circuit that is coupled to the sixth sense node.

5. The current source circuit of claim 4, wherein:
   the third current source comprises a seventh transistor having a seventh gate, a seventh drain, and a seventh source, wherein the seventh drain is coupled to the fifth sense node, and wherein the seventh transistor is sized to produce a current that is a fraction of a current that is produced by the first current source; and
   the fourth current source comprises an eighth transistor having an eighth gate, an eighth drain, and an eighth source, wherein the eighth gate is coupled to the seventh gate, the eighth source is coupled to the seventh source, and the eighth drain is coupled to the sixth sense node, and wherein the eighth transistor is sized to produce a current that is a fraction of a current that is produced by the second current source.

6. The current source circuit of claim 4, wherein:
   the first current source circuit comprises a first transistor and a second transistor, wherein the first transistor has a first gate, a first drain and a first source, the second transistor has a second gate, a second drain, and a second source, and wherein the first gate is coupled to the second sense node, the first source is coupled to the first sense node, the first drain is coupled to the first output node, and the second drain is coupled to the first sense node; and
   the second current source circuit comprises a third transistor and a fourth transistor, wherein the third transistor has a third gate, a third drain and a third source, the third gate is coupled to the fourth sense node, the third source is coupled to the third sense node, the third drain is coupled to the second output node, and the fourth drain is coupled to the third sense node;
   the first follower circuit comprises a fifth transistor having a fifth gate, a fifth drain, and a fifth source, wherein the fifth gate is coupled to the reference node, the fifth source is coupled to the first sense node, and the fifth drain is coupled to the fifth sense node; and
   the second follower circuit comprises a sixth transistor having a sixth gate, a sixth drain, and a sixth source, wherein the sixth gate is coupled to the reference node, the sixth source is coupled to the third sense node, and the sixth drain is coupled to the sixth sense node; and wherein the bias circuit is configured to provide the reference signal at the bias output, wherein a bias voltage is associated with the reference signal, the bias voltage corresponds to a sum of a saturation drain to source voltage of the second transistor and a gate to source voltage of the fifth transistor, the gate to source voltage of the fifth transistor is approximately equal to the gate to source voltage of the sixth transistor, and wherein the saturation drain to source voltage of the first transistor is equal to a saturation drain to source voltage of the third transistor.

7. The current source circuit of claim 6, wherein:

the third current source circuit comprises a seventh transistor having a seventh gate, a seventh drain, and a seventh source, wherein the seventh drain is coupled to the fifth sense node, and wherein the seventh transistor is sized to produce a current that is a fraction of a current that is produced by the first current source circuit; and the fourth current source circuit comprises an eighth transistor having an eighth gate, an eighth drain, and an eighth source, wherein the eighth gate is coupled to the seventh gate, the eighth source is coupled to the seventh source, and the eighth drain is coupled to the sixth sense node, and wherein the eighth transistor is sized to produce a current that is a fraction of a current that is produced by the second current source circuit; and wherein the bias circuit comprises:
  a ninth transistor having a ninth gate, a ninth drain, and a ninth source, wherein the ninth gate is coupled to the reference node, and wherein the ninth drain is coupled to the reference node,
  a tenth transistor having a tenth gate, a tenth drain, and a tenth source, wherein the tenth gate is coupled to the reference node, and wherein the tenth transistor is sized at least four times larger than the ninth transistor,
  an eleventh transistor having an eleventh gate, an eleventh drain, and an eleventh source, wherein the eleventh drain is coupled to the tenth source, the eleventh gate is coupled to the tenth drain, the second gate, and the fourth gate, the eleventh source is coupled to the second source and the fourth source,
  a twelfth transistor having a twelfth gate, a twelfth drain, and a twelfth source, wherein the twelfth source is coupled to the eighth source, the twelfth gate is coupled to the eighth gate, and the twelfth drain is coupled to the twelfth gate, wherein the twelfth transistor is sized significantly larger than the eighth transistor,
  a reference current source that is coupled between the eleventh source and the twelfth drain,
  a thirteenth transistor having a thirteenth gate, a thirteenth drain, and a thirteenth source, wherein the thirteenth source is coupled to the eighth source, the thirteenth gate is coupled to the eighth gate, and the thirteenth drain is coupled to the tenth drain, wherein the thirteenth transistor is approximately the same size as the twelfth transistor, and
  a fourteenth transistor having a fourteenth gate, a fourteenth drain, and a fourteenth source, wherein the fourteenth source is coupled to the eighth source, the fourteenth gate is coupled to the eighth gate, and the fourteenth drain is coupled to the reference node, wherein the fourteenth transistor is approximately the same size as the thirteenth transistor.

8. The current source circuit of claim 7, wherein the differential amplifier circuit comprises:
  a fifteenth transistor having a fifteenth gate, a fifteenth drain, and a fifteenth source, wherein the fifteenth gate is coupled to the fifth sense node,
  a sixteenth transistor having a sixteenth gate, a sixteenth drain, and a sixteenth source, wherein the sixteenth gate is coupled to the sixth sense node, and the sixteenth source is coupled to the fifteenth source;
  a seventeenth transistor having a seventeenth gate, a seventeenth drain, and a seventeenth source, wherein the seventeenth drain is coupled to the second sense node, and the seventeenth gate is coupled to the second sense node;
  an eighteenth transistor having an eighteenth gate, an eighteenth drain, and an eighteenth source, wherein the eighteenth drain is coupled to the fourth sense node, the eighteenth source is coupled to the seventeenth source, and the eighteenth gate is coupled to the fourth sense node; and
  a nineteenth transistor having a nineteenth gate, a nineteenth drain, and a nineteenth source, wherein the nineteenth drain is coupled to the seventeenth source, the nineteenth gate is coupled to the second and fourth gates, and the nineteenth source is coupled to the second and fourth sources.

9. The current source circuit of claim 8, wherein the differential amplifier circuit further comprises:
  a twentieth transistor that is coupled to the eighteenth transistor, wherein the twentieth transistor is arranged to operate as a cascode transistor in cooperation with the eighteenth transistor; and
  a twenty-first transistor that is coupled to the seventeenth transistor, wherein the twenty-first transistor is arranged to operate as another cascode transistor in cooperation with the seventeenth transistor.

10. The current source circuit of claim 7, wherein the first, second, third, fourth, tenth, eleventh, twelfth, thirteenth, and fourteenth transistors are all approximately the same size as each other, the first transistor is approximately ten times larger than the fifth transistor, and the fifth, sixth, seventh, and eighth transistor are all approximately the same size as each other.

11. A current source circuit with differential gain boosting, comprising:
  a first means for producing that is arranged to provide a first output current to a first output node, and also arranged to provide a first sense signal at a first sense node, wherein the first means for producing is responsive to a second sense signal from a second sense node;
  a second means for producing that is arranged to provide a second output current to a second output node, and also arranged to provide a third sense signal at a third sense node, wherein the second means for producing is responsive to a fourth sense signal from a fourth sense node, and wherein the first means for producing and second means for producing are arranged in cooperation to produce a first differential output signal via the first output current and the second output currents;
  a first means for servoing that is configured to servo the first sense signal to a predetermined voltage;
  a second means for servoing that is configured to servo the third sense signal to approximately the predetermined voltage; and a means for providing that is arranged to provide a second differential output signal to the second and fourth sense nodes in response to the first and third sense signals.

12. The current source circuit of claim 11, wherein:
the first means for producing comprises a first transistor and a second transistor, wherein the first transistor has a first gate, a first drain and a first source, the second transistor has a second gate, a second drain, and a second source, and wherein the first gate is coupled to the second sense node, the first source is coupled to the first sense node, the first drain is coupled to the first output node, and the second drain is coupled to the first sense node; and
the second means for producing comprises a third transistor and a fourth transistor, wherein the third transistor has a third gate, a third drain and a third source, the third gate is coupled to the fourth sense node, the third source is coupled to the third sense node, the third drain is coupled to the second output node, and the fourth drain is coupled to the third sense node.

13. The current source circuit of claim 12, wherein the pre-determined voltage is approximately equal to a drain to source saturation voltage of the second transistor, and wherein the drain to source saturation voltage of the second transistor is approximately equal to a drain to source saturation voltage of the fourth transistor.

14. The current source circuit of claim 12, wherein:
the first means for servoing comprises:
the first transistor;
a fifth transistor having a fifth gate, a fifth drain, and a fifth source, wherein the fifth gate is coupled to a reference node, the fifth source is coupled to the first sense node, and the fifth drain is coupled to a fifth sense node, and wherein the fifth transistor is arranged such that the first sense node is coupled to the fifth sense node via the fifth transistor;
a third means for producing that is configured to provide a first folding current to the fifth sense node, wherein the first folding current is a fraction of the first output current,
at least a portion of the means for providing, and
a means for biasing, wherein the means for biasing is configured to provide a bias signal to the reference node, such that a voltage associated with the bias signal is approximately equal to the sum of the gate to source voltage of the fifth transistor and the saturation drain to source voltage of the first transistor, wherein the gate to source voltage of the fifth transistor is approximately equal to the gate to source voltage of a sixth transistor, and the saturation drain to source voltage of the first transistor is approximately equal to the saturation drain to source voltage of the second transistor; and
the second means for servoing comprises:
the third transistor,
the sixth transistor having a sixth gate, a sixth drain, and a sixth source, wherein the sixth source is coupled to the third source, the sixth drain is coupled to a sixth sense node, and the sixth gate is coupled to the reference node and wherein the sixth transistor is arranged such that the third sense node is coupled to the sixth sense node via the sixth transistor,
a fourth means for producing that is configured to provide a second folding current to the sixth sense node, wherein the second folding current is a fraction of the second output current,
at least another portion of the means for providing, and the means for biasing.

15. The current source circuit of claim 14, wherein:
the third means for producing comprises a seventh transistor having a seventh gate, a seventh drain, and a seventh source, wherein the seventh drain is coupled to the fifth sense node, and wherein the seventh transistor is sized such that the first folding current is the fraction of the first output current;
the fourth means for producing comprises an eighth transistor having an eighth gate, an eighth drain, and an eighth source, wherein the eighth gate is coupled to the seventh gate, the eighth source is coupled to the seventh source, the eighth drain is coupled to the sixth sense node, and wherein the eighth transistor is sized such that the second folding current is the fraction of the second output current; and
the means for biasing comprises:
a ninth transistor having a ninth gate, a ninth drain, and a ninth source, wherein the ninth gate is coupled to the reference node,
a tenth transistor having a tenth gate, a tenth drain, and a tenth source, wherein the tenth gate is coupled to the reference node, and wherein the tenth transistor is sized at least four times larger than the ninth transistor,
an eleventh transistor having an eleventh gate, an eleventh drain, and an eleventh source, wherein the eleventh drain is coupled to the tenth source, the eleventh gate is coupled to the tenth drain, the second gate, and the fourth gate, the eleventh source is coupled to the second source and the fourth source,
a twelfth transistor having a twelfth gate, a twelfth drain, and a twelfth source, wherein the twelfth source is coupled to the eighth source, the twelfth gate is coupled to the eighth gate, and the twelfth drain is coupled to the twelfth gate, wherein the twelfth transistor is sized significantly larger than the eighth transistor,
a reference current source that is coupled between the eleventh source and the twelfth drain,
a thirteenth transistor having a thirteenth gate, a thirteenth drain, and a thirteenth source, wherein the thirteenth source is coupled to the eighth source, the thirteenth gate is coupled to the eighth gate, and the thirteenth drain is coupled to the tenth drain, wherein the thirteenth transistor is approximately the same size as the twelfth transistor, and
a fourteenth transistor having a fourteenth gate, a fourteenth drain, and a fourteenth source, wherein the fourteenth source is coupled to the eighth source, the fourteenth gate is coupled to the eighth gate, and the fourteenth drain is coupled to the reference node, wherein the fourteenth transistor is approximately the same size as the thirteenth transistor.

16. The current source circuit of claim 13, wherein the means for providing comprises:
a fifteenth transistor having a fifteenth gate, a fifteenth drain, and a fifteenth source, wherein the fifteenth gate is coupled to the fifth sense node,
a sixteenth transistor having a sixteenth gate, a sixteenth drain, and a sixteenth source, wherein the sixteenth gate is coupled to the sixth sense node, and the sixteenth source is coupled to the fifteenth source;
a seventeenth transistor having a seventeenth gate, a seventeenth drain, and a seventeenth source, wherein the seventeenth drain is coupled to the second sense node, and the seventeenth gate is coupled to the second sense node;

an eighteenth transistor having an eighteenth gate, an eighteenth drain, and an eighteenth source, wherein the eighteenth drain is coupled to the fourth sense node, the eighteenth source is coupled to the seventeenth source, and the eighteenth gate is coupled to the fourth sense node; and a nineteenth transistor having a nineteenth gate, a nineteenth drain, and a nineteenth source, wherein the nineteenth drain is coupled to the seventeenth source, the nineteenth gate is coupled to the second and fourth gates, and the nineteenth source is coupled to the second and fourth sources.

17. A method for differential gain boosting, comprising:

sensing a first sense signal that is associated with a first sense node, wherein a first current source circuit is configured to produce the first sense signal and a first output current, and wherein the first current source circuit is further configured to be responsive to a second sense signal at a second sense node;

sensing a third sense signal that is associated with a third sense node, wherein a second current source circuit is configured to produce the third sense signal and a second output current, the second current source circuit is further configured to be responsive to a fourth sense signal at a fourth sense node, and wherein the first current source circuit and the second current source circuit are arranged in cooperation to produce a first differential output signal via the first output current and the second output current;

servoing the first sense signal to a pre-determined voltage;

servoing the third sense signal to approximately the pre-determined voltage level; and producing a second differential output signal in response to the first sense signal and the third sense signal, wherein the second differential output signal comprises the second sense signal and the fourth sense signal.

18. The method of claim 17, wherein the first and second current source circuits each comprise a cascode transistor and a current source transistor, wherein a source of the cascode transistor of the first current source circuit is coupled to the first sense node, a source of the cascode transistor of the second current source circuit is coupled to the third sense node, a gate of the cascode transistor of the first current source circuit is coupled to the second sense node, and a gate of the cascode transistor of the second current source circuit is coupled to the fourth sense node.

19. The method of claim 18, wherein the pre-determined voltage is approximately equal to a drain to source saturation voltage of the first current source transistor, and wherein the drain to source saturation voltage of the first current source transistor is approximately equal to a drain to source saturation voltage of the second current source transistor.

* * * * *

UNITED STATES PATENT AND TRADEMARK OFFICE
CERTIFICATE OF CORRECTION

PATENT NO. : 6,930,542 B1
DATED : August 16, 2005
INVENTOR(S) : Arlo Aude

It is certified that error appears in the above-identified patent and that said Letters Patent is hereby corrected as shown below:

Title page,
Item [56], References Cited, OTHER PUBLICATIONS,
"Gray et al," reference, delete "et al," and insert -- et al., --.

Drawings,
Sheet 2 of 2, Fig. 2 (Above Node N124), delete "$V_{DN}$" and insert -- $V_{ON}$ --.
Sheet 2 of 2, Fig. 2 (Below Current 12), delete "M7" and insert -- M17 --.
Sheet 2 of 2, above Current I1) delete "$V_{DD}$" and insert -- $V_{OP}$ --.

Column 2,
Line 31, delete "11" and insert -- I1 --.
Line 31, delete "12" and insert -- I2 --.

Column 4,
Line 16, delete "Of" and insert -- of --.
Line 58, delete "M117" and insert -- M17 --.

Column 8,
Line 62, delete "currents" and insert -- current --.

Signed and Sealed this

Twentieth Day of December, 2005

JON W. DUDAS
*Director of the United States Patent and Trademark Office*